United States Patent [19]

Lee et al.

[11] 3,999,133

[45] Dec. 21, 1976

[54] AUTOMATIC GAIN CONTROL FOR TRANSDUCER CIRCUIT

[75] Inventors: Siu Kee Lee, Sunnyvale; John Cuda, Saratoga, both of Calif.

[73] Assignee: Sperry Rand Corporation, New York, N.Y.

[22] Filed: Jan. 16, 1976

[21] Appl. No.: 649,867

[52] U.S. Cl. .................................. 328/2; 307/311; 307/235 K; 307/264
[51] Int. Cl.$^2$ ........................................ H03K 3/42
[58] Field of Search ............. 307/264, 311, 235 A, 307/235 K; 328/2, 150; 330/59, 102

[56] References Cited

UNITED STATES PATENTS

| | | | |
|---|---|---|---|
| 3,564,301 | 2/1971 | McGhee | 328/2 |
| 3,949,233 | 4/1976 | Gluck | 307/311 |

Primary Examiner—Stanley D. Miller, Jr.
Assistant Examiner—B. P. Davis
Attorney, Agent, or Firm—Gerald L. Moore

[57] ABSTRACT

A circuit for controlling the gain of a transducer circuit by detecting the peak voltage of the transducer circuit, comparing the voltage with the reference voltage and modifying the output of the transducer circuit in a direction to adjust the output voltage towards a desired voltage.

5 Claims, 6 Drawing Figures

AUTOMATIC GAIN CONTROL FOR TRANSDUCER CIRCUIT

BACKGROUND OF THE INVENTION

Various transducer circuits such as that disclosed in U.S. Pat. No. 3,597,750, issued on Aug. 3, 1971, and assigned to the same assignee, are used for detecting the position of movable members or other such apparatus. In this patent a plurality of light emitting diodes are positioned adjacent a grid which includes spaced opaque lines mounted on a movable member. Photo diodes (light detectors) are positioned on the opposite sides of the grid such that as an opaque line passes between the LED and the photo diodes, there is detected a light change for enabling the sensing of the position corresponding to that opaque line.

As evidenced in this patent, problems are encountered because the light output generated by LEDS and other such light sources changes with usage. Also, since the characteristics of light transducers are different from device to device, it is impossible to maintain an equal output signal from each transducer by using a fixed control signal. That means certain adjustments of the control signal have to be made for each transducer in order to achieve the desired output signal which adjustments are very tedious and expensive. However to maintain the system at a high operating efficiency it is desirable to sustain the light output at a desired level. Naturally the transducers will not indicate whether such gradual changes in the light are due to the positioning of the grid or to a deterioration in the light source. In order to assure that the changes in light value detected are always due to changes in position of the movable member only, the light emitted from the light emitting diode must be maintained substantially constant. To maintain the light emitted constant the transducer gain must be detected in some manner, however there is no available reference with which to compare this gain, which is the ratio of the transducer output value to the grid spacing (position) being measured. But since the output signal is cyclic with movement of the grid, use can be made of the momentarily measurable peak value to set the transducer gain automatically.

It is the purpose of this invention to sense the gain of such a light transducer and provide a circuit for readjustment thereof to maintain the output signal at a desired level.

SUMMARY OF THE INVENTION

An automatic gain control for regulating the peak voltage of a circuit, which circuit includes means for causing the circuit to generate a cyclic voltage output, means to generate a reference signal by adding a constant voltage to the cyclic signal, means for holding the peak value of the cyclic signal until the reference signal equals the peak value for generating a pulse per cycle immediately after the peak value is attained and means acting in response to the pulse to compare the cyclic signal to a desired value for the cyclic signal and to alter the gain of the circuit to adjust the peak value of the cyclic signal towards the desired value.

DESCRIPTION OF THE INVENTION

Figure 1:
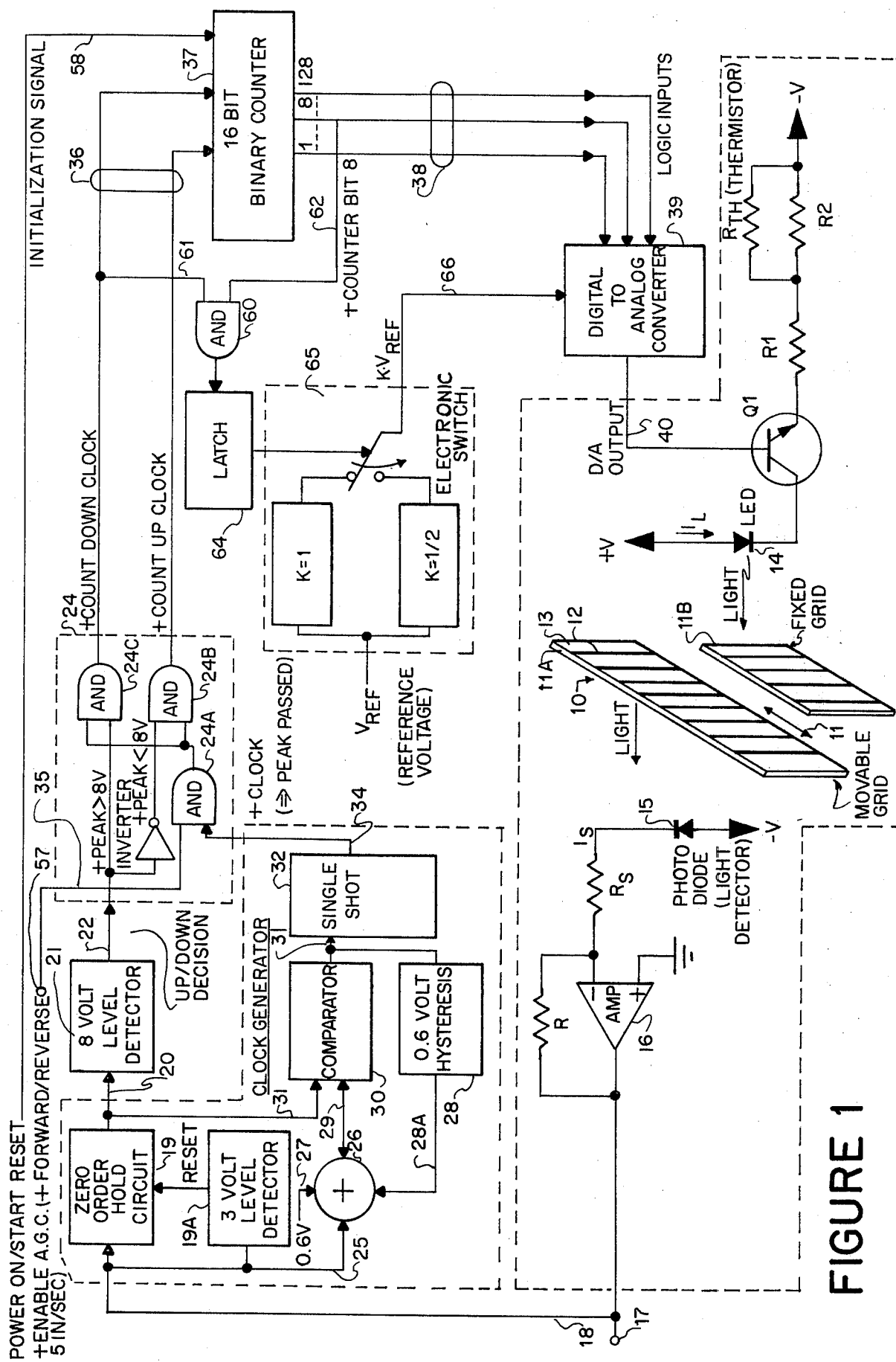
FIG. 1 is a circuit diagram showing a position detecting circuit utilizing a light optic system and incorporating the subject invention.

A typical transducer system in which the subject invention can be applied is shown in FIG. 1. This system is used for detecting the position of a target or grid 10 including a movable grid 11A fixed to a movable member (not shown) which can be shifted in position in the direction of the arrow 11. It is the position of this movable member which it is desired to detect. Positioned adjacent the movable grid 11A is a stationary grid 11B. In this embodiment each grid comprises a transparent body 13 on which are fixed a series of opaque lines 12 in parallel spaced relationship. Positioned to one side of this grid is a light emitting diode (LED) 14 for directing light through the grids to a light detector 15 positioned on the opposite side of the grids. The combination of the LED, the light detector and the grid form a position transducer for indicating movement of the movable member. The position transducer is described as one example of a circuit in which the invention can be used.

As a result of light striking the light detector 15 an output current $I_s$ is generated which is amplified in an amplifier 16 having a feedback circuit through a resistor R. Thus there is supplied at the terminal 17 an output signal modulated by the passage of the opaque lines 12 between the diode 14 and the light detector 15. While a specific system utilizing LEDs is described, the subject invention is applicable to other cyclic circuits in which it is desirable to maintain the gain at a pedetermined level.

By detecting the signal at the terminal 17 the position of the movable member 10 with respect to the fixed grid is indicated. Naturally it is necessary to maintain at least a minimum light level generated by the diode and for regulation of this light level, the LED current $I_L$ is controlled by regulation of the base voltage on the transistor Q1, which establishes the emitter voltage on the transistor Q1. $I_L$ which is also the collector current of transistor Q1 is controlled by the differential voltage across the combination of the resistors R1, R2 and $R_{TH}$. It can be seen that by increasing the base voltage the LED current is increased to increase the light output thereof.

In the past, the LED current has been adjusted to a predetermined value somewhat above the optimum light output and thereafter because of decay in the normal manner the light will diminish to a level hopefully somewhere near the optimum level with subsequent usage. Even though the LED current originally is set at a predetermined optimal value, readjustment of the LED current is required after a certain period of time (due to the deteriorations of the LED characteristics which cannot be entirely eliminated or controlled). The decay characteristic is common with LEDs and in fact, to limit somewhat the decay rate of the light emission, such emitters frequently are "burned in" by being energized for a given period of time prior to usage in a system so that the initial faster rate of change in light output usually occurring is surpassed and a more constant light output versus time used is reached. However such past precautions and adjustments naturally are based upon a prediction of the average behavior for such LEDs and is not necessarily foolproof.

In the past there have been attempted various methods for adjusting the output of such LEDs. Providing such automatic controls is made more difficult because there is not a totally predictable correlation between the LED current and the light output. This fact dictates that for accuracy, the actual light output must be monitored and measured and any subsequent adjustment be made based on the detected light to regulate the peak signal output to a desired level for a known change in position.

However the normal application for such LEDs in the detection of position as in the subject system requires the transducer output signal to be a sawtooth waveform as the opaque lines 12 pass by the transducer. Such an output waveform dictates that a momentary peak value must be detected and it is difficult to sense the peak and trigger a circuit at that precise time. It is therefore the purpose of the present invention to provide a circuit for sensing and automatically adjusting the signal level by regulating the light output for an LED used in a system of the type previously described, and then permanently holding the setting.

In accordance with the present invention there is provided a circuit which receives the output signal from the transducer, detects the peak value and compares it with a reference signal to determine whether the peak level is too high or too low. During the period of comparison, a clocking pulse is generated which, with the result of such comparison, permits the feeding of the too high or too low signal information to a binary counter. The binary counter supplies to a digital-to-analog converter a signal indicating the need for raising or lowering the output level of the LED. The converter in turn adjusts the LED current in a direction to bring it nearer to the desired output level.

Accordingly the output signal from the amplifier 16 is fed through the conductor 18 to a zero-order-hold circuit 19. This circuit functions to hold the signal received at a constant level once a maximum or peak level has been reached and the signal begins to diminish. This constant signal is fed through the conductor 20 to a level detector which in turn feeds a differential signal through the conductor 22 indicating whether or not the zero-order-hold signal is above or below a desired value. In the case of the subject LED circuit, a representative value of that desired level is 8 volts. Thus if the zero-order-hold output signal is above 8 volts the level detector 21 will supply a differential signal through the conductor 22 to the gating control circuit 24 indicating the LED output is higher than desired. However this signal must be clocked to occur momentarily after the maximum output level has been reached.

Figure 3:
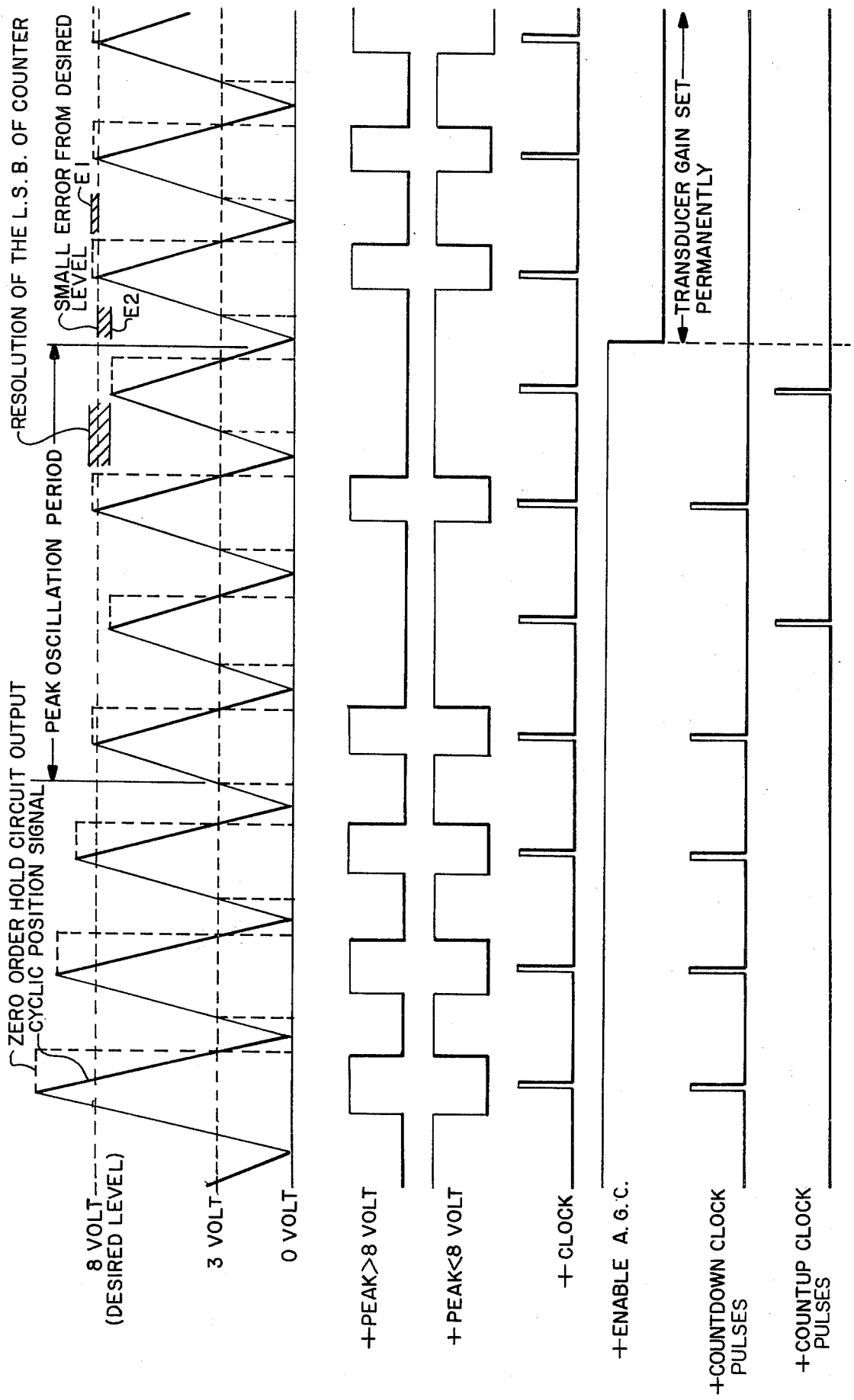
FIG. 3 shows a plot of the typical regulating signal for readjusting the transducer output signal.

In the gating control 24 the enabling signal from 57 allows the passage of a clock pulse from the single shot output 32 through the AND gate 24A to the inputs of the AND gates 24B and 24C during the automatic gain control period. The output of the 8 volt level detector, which provides the information whether the peak value is above or below 8 volts for the up-down decision for the binary counter, gates the clock pulses from the gate 24A through the gate 24B or the gate 24C to the input of the binary counter as count-up clock or count-down clock, respectively, to cause the counter to either count up or count down. If the peak value is above 8 volts it counts down. On the other hand, if the peak value is below 8 volts the clock counts up. The timing and waveforms for these operations are illustrated in FIG. 3. The zero-order-hold circuit is reset each time the output signal level on conductor 25 diminishes to a predetermined level (which in this case is 3 volts) by operation of the level detector 19A.

To accomplish the clocking of the signal so as to change or to set the digital binary counter, the output signal from the amplifier 16 is fed simultaneously through the conductor 25 to a summing juncture 26. Supplied to this summing junction is a standard constant signal which in the illustration described is 0.6 volts supplied through the conductor 27 from a supply (not shown). Also supplied through the conductor 28A from a source 28 to the summing juncture is a constant hysterisis signal which in this illustration is 0.6 volt. Thus the actual position signal is increased by a bias signal of 1.2 volts to generate a second signal. This increased position or second signal is fed through the conductor 29 to a comparator 30 to be compared to the zero-order-hold signal supplied through the conductor 31. When these signals are equal, the comparator 30 will emit a signal causing the firing of a single shot 32 which supplies a momentary pulse through the conductor 34 to the gating control circuit 24. With the presence of another enabling signal through the conductor 35, which signal will be explained later, the 8 volt level detector 21 output information is transmitted through the conductors 36 to the binary counter 37 as the count up or count down commands.

The binary counter 37 thus is adjusted up or down to supply through conductors 38 a digital signal to the digital to analog converter 39 calling for a resetting of the base voltage of the transistor Q1 transmitted through the conductor 40. In this manner the LED current is readjusted in the direction to shift the output signal generated by the light detector 15 towards the required value. It can be seen that such shifting is done one increment at a time since the binary counter is supplied only a single pulse for readjusting the setting thereof.

Figure 2:
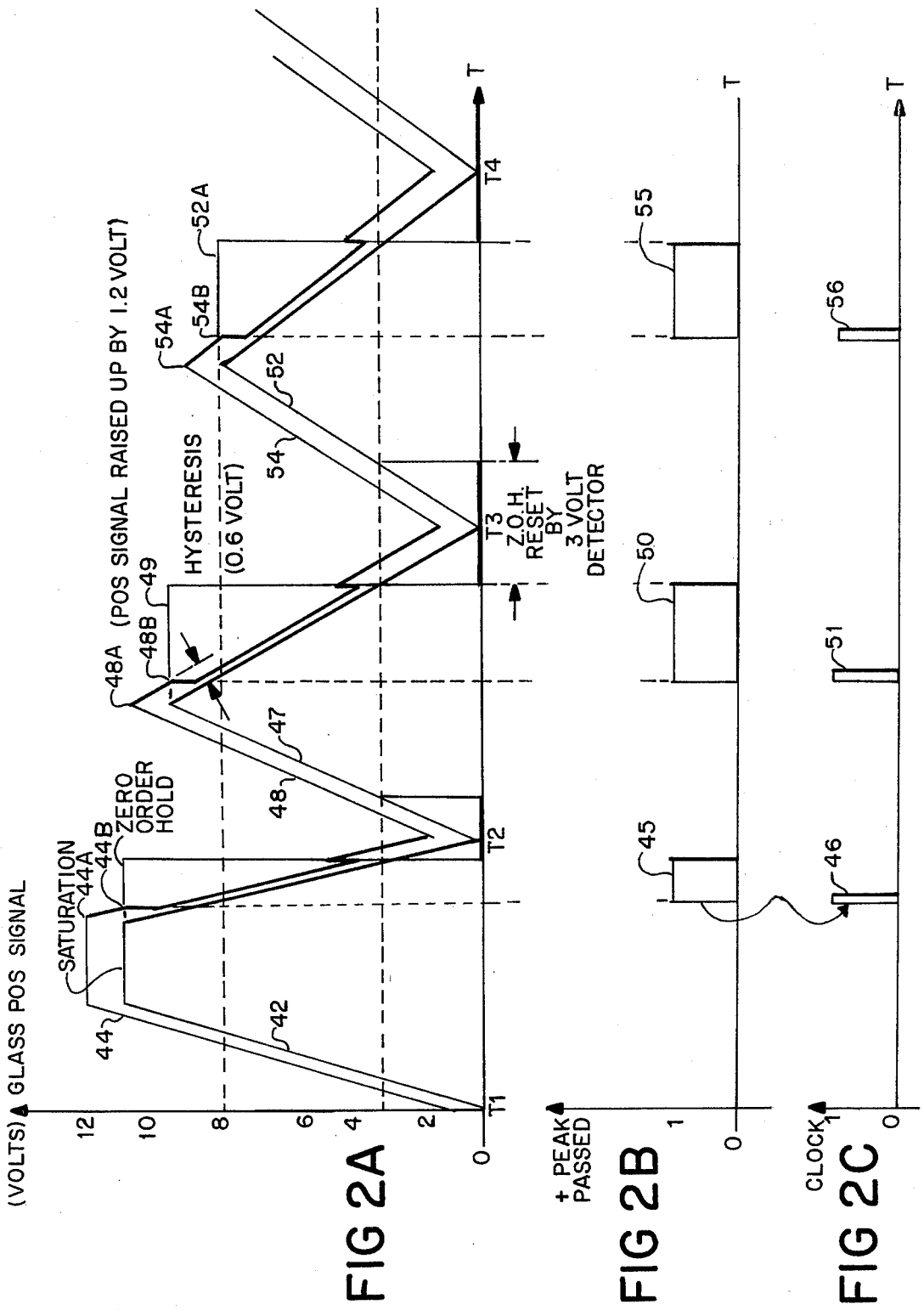
FIGS. 2A, 2B and 2C are selected waveforms from the circuit of FIG. 1.

To further explain the invention, reference can be made to FIG. 2A showing the position signal during the time period T1 to T2 as the waveform 42. In the example shown, this signal surpasses the optimum 8 volt level and in fact, reaches a plateau indicating saturation of the amplifier 16. With the peaking of this signal the zero-order-hold signal is maintained constant at this level. This signal is also fed through the summing juncture 26 for the addition of the 0.6 volt constant signal and the 0.6 volt hysteresis to provide the input to the comparator 30 through the conductor 29 being indicated by the waveform 44. This waveform also passes the saturation point and, with the normal movement of an opaque line 12 back into the path of the light between the LED and the light detector, starts to diminish at the point 44A. At the point 44B the waveforms intersect causing a generation of the signal 45 indicating that the peak has been passed (FIG. 2B). The leading edge of this signal triggers the non-retriggerable single shot 32 resulting in the output pulse 46 (FIG. 2C) being generated, which pulse is shorter in duration than the signal 45. Since the total pulse 46 lies inside the differential output signal of the 8 volt level detector, a count-up or count-down clock signal is generated for the binary counter.

Since the 8 volt level detector has indicated the signal to be too high, the counter 37 acting through the D/A converter 39 will readjust the base voltage of the transistor Q1 to reduce the output from the light emitting diode. For the period T2 to T3 with the reduction of the signal, once again the position signals are indicated by the waveform 47 with the output from the summing juncture 26 indicated by the waveform 48. These waveforms peak before saturation of the amplifier 16 with the zero-order-hold signal being indicated by the constant signal 49. The comparator input signal from the summing junction 26 peaks at the point 48A and at point 48B intersects or equals the zero-order-hold signal to cause the comparator once again to provide an output signal 50. In turn a pulse 51 is generated which again is fed to the binary counter indicating adjustment of the diode current downward.

From the time period T3 to T4 with further readjustment of the LED output illumination, the position signal as indicated by the waveform 52 and the summing juncture 26 output signal to the comparator 30 is indicated by the waveform 54. Once again the summing juncture signal peaks at point 54A and intersects the zero-order-hold signal 52A at the juncture 54B. However as can be noted from the graph of FIG. 2A, the peak value of the cyclic signal (position signal) is very close to the desired value (8 volt) which is the ideal target for the peak. In practice, the position peak signal never stays at 8 volts exactly because the 8 volt level detector circuit compares the zero-order-hold circuit output with an 8 volt constant reference voltage and only detects whether the peak signal is above or below 8 volts. As the peak signal is exactly on the 8 volt boundary, the counter will count up and count down by 1 bit (the LSB) alternatively. This means the peak signal level will be oscillating slowly around the 8 volt level. The small signal difference from the 8 volt level depends on the weight of the least significant bit (LSB) of the binary counter on the LED current, that is the resolution of the D/A converter. Since such error is quite small and not significant in the present system, it can be ignored.

As can be seen in FIG. 3, when the peak value peak position signal is at the boundary of 8 volts, the peak will oscillate between $(8+E_1)$ volts and $(8-E_2)$ volts where $E_1$ and $E_2$ is equivalent to the resolution of the LSB of the counter. The peak oscillation continues until the "+ Enable A.G.C." signal drops. Then the up/down operation of the binary counter is inhibited, consequently the transducer gain is set permanently. Thus it can be seen that the light emitting diode output illumination is regulated by adjustment of the current therethrough.

Such an enabling signal for initiating the checking, adjusting and permanently setting of the diode current is received at the junction 57. Usually such a signal is supplied during a time when the movable member is being driven at a known rate, or at some other time when adjustment of the position detecting signal will not interfere with the overall operation of the system. Of course the supplying of such a signal depends upon the individual characteristics of the apparatus to which the subject invention is applied.

There also is supplied to the binary counter 37 an initialization signal through the conductor 58. This initialization signal merely sets the counter at a value which will be known to provide an output illumination from the LED. Thus initialization of the binary counter merely assures that the LED will be energized sufficiently to render a light output somewhere in the general range desired or larger and from then the automatic gain control for the LED circuit can adjust the LED current to a desired value.

In accordance with another feature of the invention there is provided a means for rapidly adjusting the LED current if it appears that the present setting of the LED is substantially different from the desired setting. The circuit is indicated in FIG. 1 comprising the AND gate 60 which is supplied the output signal from the gating control circuit 24 through the conductor 61 and the counter bit 8 signal through the conductor 62. The overall functioning of this signal is to detect when the binary counter has adjusted in the same direction after initialization for a duration of eight counts. Upon the occurrence of the eighth count a signal is supplied indicating this fact and causing an adjustment of the D/A converter output signal to a level halfway between the present setting and either the maximum or minimum setting depending upon the direction in which the initial eighth adjustments have been made.

In operation, if the initial adjustments have all been made to lower the LED current, upon the occurrence of the eighth count adjustment the converter will be reset to a point halfway between the present setting and the minimum setting. Similarly if all of the eight adjustments have been to increase the LED current, the immediate adjustment will occur to a level halfway between the present setting and the maximum setting. Since the general range of setting required by the LED is much lower than the initialization level, only the former (count-down) case is implemented in the present invention for simplicity. The maximum output of the D/A converter can be as high as twice the initialization level so as to ensure meeting the worst case requirement of the LED current. Thus with the occurrence of the count 8 signal through the conductor 62 and the count-down clock pulse, the AND gate 60 will conduct causing a latch 64 to energize the amplifier 65 and supply half of the initial reference voltage ($K=\frac{1}{2}$) through the conductor 66 to the D/A converter thus changing the gain of the converter to half of the original value.

Figure 4:
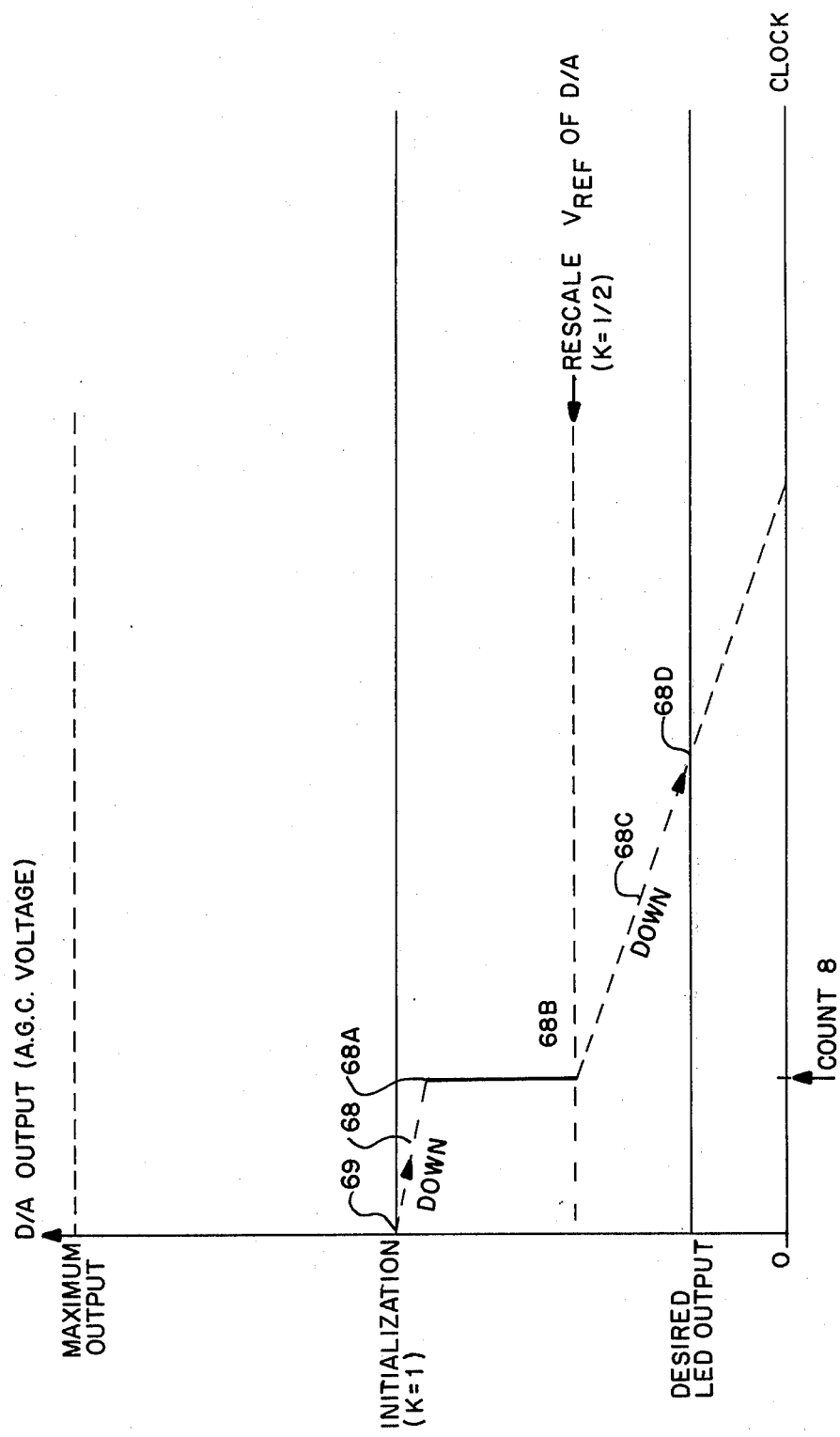
FIG. 4 shows a plot of the output signal during adjustment.

This function is further illustrated in FIG. 4 showing the digital to analog converter 39 output signal versus the clocking signal generated by the single shot 32. As can be seen, with the initialization signal through the conductor 58, the binary counter 37 is set to cause the converter to generate an initial signal 68 starting at the level indicated by the point 69. In this instance the LED output is above the desired level and therefore the waveform 68 is decreasing with the clocking signal. Upon the occurrence of the eighth count from the binary counter, the AND gate 60 is rendered conductive because of the receipt of the bit 8 signal from the counter. The latch 64 is caused to energize the amplifier 65 which immediately decreases the signal to approximately one-half the value between the point 68A and the zero value. Thus the signal is reset to the point 68B which still renders an output signal level too high resulting in the waveform once again decreasing along the line 68C until it reaches the desired level at point 68D.

The invention claimed is:

1. An automatic gain control for regulating the peak output signal of a circuit which generates a cyclic output signal having a peak level responsive to the level of an input signal, said control comprising:

means to cause said circuit to generate the first cyclic output signal;

means to generate a second signal by adding a bias signal to said output signal;

means to generate a constant level signal equal to the peak value of said output signal after the output signal peak level has been reached;

means to compare the second signal and the constant level signal and generate a pulse when said signals are equal;

means to compare said cyclic signal peak value with a desired signal and generate a differential signal when said pulse is generated; and means to readjust said circuit in response to said differential signal for causing said cyclic signal to have a new peak level adjusted toward said desired signal level.

2. A control as defined in claim 1 wherein said circuit is adjusted an incremental amount each time said pulse is generated and in a direction responsive to the differential signal.

3. A control as defined in claim 2 including means for detecting readjustment of said circuit a predetermined number of times in the same direction, and means for readjusting said circuit a plurality of incremental amounts thereafter in the directions said circuit was previously adjusted to diminish the time for adjusting the circuit such that the peak output signal equals the desired signal level.

4. A control as defined in claim 3 wherein said circuit includes a light emitting diode and a light detector for generating an output signal responsive to light received from the light emitting diode, in combination with a target movable between said light emitting diode and said light detector for causing said output voltage to be cyclic.

5. A control as defined in claim 4 including means to supply an input signal having a predetermined value when said circuit is first energized.

* * * * *